United States Patent [19]

Fox, III

[11] Patent Number: 5,053,105

[45] Date of Patent: Oct. 1, 1991

[54] PROCESS FOR CREATING AN ETCH MASK SUITABLE FOR DEEP PLASMA ETCHES EMPLOYING SELF-ALIGNED SILICIDATION OF A METAL LAYER MASKED WITH A SILICON DIOXIDE TEMPLATE

[75] Inventor: Angus C. Fox, III, Boise, Id.

[73] Assignee: Micron Technology, Inc., Boise, Id.

[21] Appl. No.: 555,278

[22] Filed: Jul. 19, 1990

[51] Int. Cl.$^5$ .................... H01L 21/306; B44C 1/22; C03C 15/00; C23F 1/00

[52] U.S. Cl. .................... 156/643; 156/646; 156/651; 156/653; 156/656; 156/657; 156/659.1; 156/661.1; 156/662

[58] Field of Search ............... 156/643, 646, 650, 651, 156/652, 653, 656, 657, 659.1, 661.1, 662; 204/192.32, 192.35, 192.37; 427/38, 39, 96; 437/200, 201, 233, 238, 241, 245

[56] References Cited

U.S. PATENT DOCUMENTS

| | | | |
|---|---|---|---|
| 4,389,429 | 6/1983 | Soclof | 156/648 X |
| 4,657,628 | 4/1987 | Holloway et al. | 156/643 |
| 4,925,524 | 5/1990 | Beatty | 156/643 |
| 4,925,813 | 5/1990 | Autier et al. | 437/228 |

Primary Examiner—William A. Powell
Attorney, Agent, or Firm—Angus C. Fox, III

[57] ABSTRACT

A process, compatible with reduced-pitch masking technology, for creating a metal etch mask that will not erode in a halogenated-plasma etch environment. The process begins by creating an isolation layer (preferably of silicon dioxide) on top of the layer to be etched (typically a silicon substrate). A thin layer of a metal selected from a group consisting of cobalt, nickel, palladium, iron, and copper is then deposited on top of the isolation layer. A hard-material mask (preferably of silicon dioxide) is then created on top of the metal layer as though it were to be the final etch mask. A layer of polysilicon is then blanket deposited on the surface of the in-process wafer. The polysilicon layer must be sufficiently thick to entirely convert exposed regions of the underlying metal layer to silicide during a subsequent elevated temperature step. Only metal in regions not covered by the hard-material mask is converted to silicide. Unreacted polysilicon is then removed with a wet polysilicon etch, followed by the removal of the hard-material mask with a wet etch selective for silicon dioxide over the existent metal silicide, followed by removal of the metal silicide with a wet etch selective for silicide over silicon dioxide to avoid undercutting the oxide isolation layer beneath the metal layer remnants. The metal layer remnants constitute a metal mask which precisely duplicates the pattern of the hard-material mask.

8 Claims, 5 Drawing Sheets

PROCESS FOR CREATING AN ETCH MASK SUITABLE FOR DEEP PLASMA ETCHES EMPLOYING SELF-ALIGNED SILICIDATION OF A METAL LAYER MASKED WITH A SILICON DIOXIDE TEMPLATE

FIELD OF THE INVENTION

This invention relates to semiconductor plasma etch process technology and, more specifically, to processes-compatible with reduced-pitch masking technology---for creating metal etch masks that are not subject to erosion in a halogenated-plasma environment.

BACKGROUND OF THE INVENTION

A process for creating an etch mask having feature widths less than the resolution capability of available photolithography is disclosed in a copending U.S. patent application submitted by Tyler Lowrey and Randal Chance of Micron Technology, Inc. The application, entitled "Method for Reducing by a $2^{-N}$ the Minimum Masking Pitch of a Photolithography Process used in the Fabrication of an Integrated Circuit", was filed on May 7, 1990 and assigned Ser. No. 07/519,992. The process makes use of edge definition (thin vertical film layer segments created using an anisotropic spacer etch) to create a hard-material (silicon dioxide) mask consisting of substantially parallel stringers (spacer strips), each of which is half the minimum feature width (F) of the available photolithographic process. The stringers are separated, one from another, by gaps which are also equal to F. The process may be further replicated in order to create masks with stringers having feature widths of $\frac{1}{4}$F., $\frac{1}{8}$F., and so on. The Lowrey-Chance reduced-pitch masking process has been incorporated into a process sequence for creating an ultra-dense dynamic random access memory array which is the subject of U.S. Pat. No. 5,013,680, which was originally filed July 18, 1990 as applicatioon Ser. No. 07/555,980, and is entitled "Process for Fabricating a DRAM Array Having Feature Widths that Transcend the Resolution Limit of Available Photolithography". The process, developed by Tyler Lowrey, Randal Chance, Mark Durcan, Ruojia Lee, Charles Dennison, Yauh-Ching Liu, Pierre Fazan, Fernando Gonzalez and Gordon Haller (all of Micron Technology, Inc.), utilizes the Lowrey-Chance masking process for creating a hard-material mask that is used to anisotropically etch a series of parallel isolation trenches in a silicon substrate. The DRAM fabrication process also requires the creation of a second hardmaterial mask, having feature widths equal to 1$\frac{1}{2}$F. separated by gaps equal to $\frac{1}{2}$F., that is used to anisotropically etch a matrix of storage trenches. Each hard-material strip of the first hard-material mask has one rounded shoulder, while each hard-material strip of the second hard-material mask has rounded shoulders on both edges. Round-shouldered edges on masking strips is responsible for a certain amount of ion reflection during a plasma etch that, under certain conditions, may lead to the etching of irregularly-shaped trenches.

With the aim of reducing plasma particle reflection from the rounded shoulders of the hard-material strips which comprise the aforementioned hard-material masks, Mark Durcan and Ruojia Lee, two of the aforementioned inventors, developed a process for rectangularizing asymmetrical silicon dioxide spacer strips. The process has been disclosed in a copending U.S. patent application entitled "Method for Rectangularizing Asymmetrical Spacers in a Process for Reducing Minimum Masking Pitch", that was filed on May 10, 1990 and assigned serial No. 07/526,079.

Silicon dioxide has become the preferred hard-mask material for anisotropically etching trenches in silicon, and as heretofore explained, the hard-material etch masks used to create the ultra-dense DRAM array are preferably created from silicon dioxide. In a chemically-halogenated plasma (the standard environment for such etches), silicon dioxide has a reactivity (also termed "selectivity") approximately 1/40 to 1/10 that of silicon. In other words, a silicon dioxide etch mask is subject to a certain amount of erosion during the etch step. For a given mask thickness, mask selectivity effectively limits trench depth. At the high end of the selectivity range, it is necessary to alter the chemistry of the plasma with chemical species that tend to cause deposition of unwanted materials on the surfaces of the etch chamber. For example, the presence of oxygen radicals and ions, chemical species that enhance selectivity of silicon over oxide during a halogenated-plasma etch, react with the silicon substrate to form silicon dioxide that is deposited as a glass layer on etch chamber walls. Deposited materials represent a potential source of pollution that must be periodically removed from the chamber. In addition, since mask selectivity may also be etch-rate dependent, it may be necessary to perform a plasma etch at an inconveniently slow rate in order to achieve a desired trench depth with an oxide mask of optimal maximum thickness. Additionally, as silicon dioxide masking material is eroded during a plasma etch, it may be redeposited on trench sidewalls near the trench mouth, further complicating the fabrication process. Finally, if MOS gates have been created prior to an anisotropic plasma etch, removal of a silicon dioxide patterning mask with an isotropic oxide etch subsequent to the trench etch may compromise the integrity of existing gate oxide. This is especially true at gate edges.

Recognizing the need for an etch mask that would permit cleaner etching environments and that would not significantly erode during an extended halogenated-plasma etch required for deep trenches, David Cathey and Trung Doan of Micron Technology, Inc., developed a metal masking process that is the subject of U.S. Pat. No. 5,001,085, which issued on Mar. 19, 1991, and is entitled "Process for Creating an Erosion-Resistant Metal Etch Mask for HalogenPlasma Excavation of Deep Trenches". This patent matured from application Ser. No. 07/554,630, which was filed on July 17, 1990. Masks are created from either cobalt, nickel, palladium, iron or copper, with react with silicon at elevated temperatures to form a metal silicide, which have melting points appreciably greater than 850° C. (the approximate temperature at which polycrystalline silicon is normally deposited), and which do not react with chlorine, fluorine, or bromine to form volatile compounds with boiling points below approximately 300° C. (a necessary criterium for a material to be immune to erosion during a halogenated-plasma etch). The masking process begins by creating a thin isolation layer of either silicon nitride or silicon dioxide (preferably the latter due to the perforation defects common to a deposited nitride layer) on top of the layer to be etched (typically a silicon substrate). A thin layer of one of the metals selected from the aforementioned list of five is then deposited on top of the isolation layer. A layer of polysilicon is then blanket deposited on top of the metal layer. The thickness of the polysilicon layer must be at least sufficient to entirely consume the metal layer when silicide-forming temperatures are reached. Photoresist masking is then performed as though the photoresist were the actual pattern for the desired trench etch. Exposed portions of the polysilicon layer are then etched away, preferably with an anisotropic etch in order to protect the polysilicon layer from undercutting. Following a photoresist strip, the substrate and overlying layers are subjected to an elevated temperature step, which causes the polysilicon to react with the underlying metal layer to form metal silicide. The metal layer is prevented from reacting with the silicon of the substrate by the isolation layer in regions where no polysilicon is superjacent the metal layer, no silicide is formed, and the metal layer remains intact. Next, the metal silicide is removed with a wet etch. A metal mask remains that is essentially an exact image of the original photoresist mask. The metal mask may then be utilized as an etch mask in a halogenated-plasma etch environment. Trenches may be etched to any desired depth with virtually no erosion of the metal mask. Once the trench etch is complete, the metal etch mask may be stripped utilizing a wet reagent such as aqua regia. As a note of explanation, it should be stated that a metal mask may not be successfully created by directly etching a photoresist-masked metal layer with an aqua regia solution because of the undercutting of the metal layer that would invariably accompany such an etch. Undercutting may also be exacerbated by lifting of the photoresist in the presence of such a reagent. The more the metal layer is undercut, the more the desired pattern is distorted.

Although the Cathey-Doan process may be successfully used to replace silicon dioxide masks in conventional masking operations which use photoresist to directly pattern silicon dioxide that is subsequently used in a halogenated-plasma environment to etch trenches, it is not directly applicable to the Lowrey-Chance reduced-pitch masking process. Nevertheless, a metal masking process applicable to the Lowrey-chance process holds the promise of elimination of asymmetrical mask stringers, combined with the ability to etch deep trenches that will certainly be required for optimum bitline signal strength in a DRAM array created using those reduced-pitch masking techniques.

SUMMARY OF THE INVENTION

The masking process that constitutes this invention is similar, in certain respects, to the Cathey metal mask process. However, the process of this invention is notable in that it is compatible with the Lowrey-Chance reduced-pitch masking process. By using this new metal mask process in conjunction with the Lowrey-Chance masking process, asymmetrical masking strips are replaced by mask components of uniform thickness that are virtually impervious to halogenated-plasma attack during deep trench etches. Cleaner etch environments are also possible, since plasma chemistry may be much simpler when an erosion-proof metal mask is employed.

Like the Cathey-Doan process, the new metal mask process begins by creating a thin isolation layer on the layer to be etched. The isolation layer may be either silicon nitride or silicon dioxide, both being materials that are capable of blocking a silicidation reaction between a subjacent silicon layer and a superjacent metal layer. Silicon dioxide, however, is considered the preferred material due to the existence of perforation defects in a deposited nitride layer which must be oxidation annealed. Typically, the layer to be etched will be silicon substrate, and a silicon dioxide isolation layer may be thermally grown on the substrate surface. A thin layer of a metal selected from a group consisting of cobalt, nickel, palladium, iron and copper (the same group identified by Cathey and Doan for their process) is then deposited on top of the oxide isolation layer. A hard-material mask is then created on top of the metal layer as though it were to be the final etch mask (the pattern of the hardmaterial mask will be replicated in the metal layer). The material of the hard-material mask must be capable of blocking silicidation of the subjacent metal layer. Although either silicon nitride or silicon dioxide will fulfill this requirement, silicon dioxide is preferred because it tends to transmit less stress to adjacent silicon layers during elevated temperature steps, and a deposited nitride layer requires an additional oxygen anneal step to eliminate any perforation defects. Following the creation of the hard-material mask on top of the metal layer, a layer of polysilicon is blanket deposited on the surface of the in-process wafer. The polysilicon layer must be sufficiently thick to entirely convert exposed regions of the underlying metal layer to silicide during a subsequent elevated temperature step. Only metal in regions not covered by the hard-material mask is converted to silicide. Unreacted polysilicon is then removed with a wet polysilicon etch, followed by the removal of the silicon dioxide hard-material mask with a wet etch selective for silicon dioxide over the metal silicide, followed by removal of the metal silicide with a wet etch selective for silicide over oxide to avoid undercutting the oxide isolation layer beneath the remnants of the metal layer. The metal layer remnants constitute a metal mask which precisely duplicates the pattern of the hard-material mask. The oxide that was subjacent the silicided metal is still intact, and may be removed at the onset of the trench etch for which the metal mask will be used.

PREFERRED EMBODIMENT OF THE INVENTION

Figure 1:
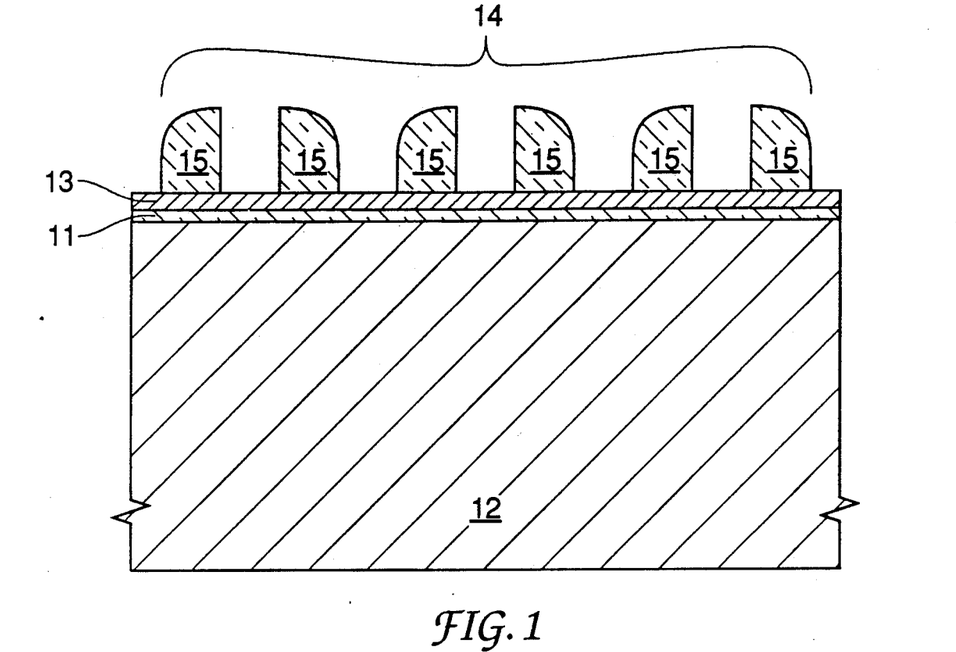
FIG. 1 is a cross-sectional view of an integrated circuit undergoing fabrication on a silicon wafer, showing a portion of the wafer substrate following thermal growth of a silicon dioxide isolation layer, deposition of a thin metal layer on top of the isolation layer, and the creation of a silicon dioxide, hard-material mask having a desired etch pattern.

Referring now to FIG. the reduced-pitch mask compatible process for creating a metal etch mask, that will not erode in a halogenated-plasma etch environment, begins with the thermal growth of a silicon dioxide isolation layer 11 on top of a silicon substrate 12. Optimum thickness of the isolation layer is considered to be within a range of approximately 50-100Å. A thin metal layer 13 is then deposited on top of isolation layer 11. Optimum thickness of the metal layer is considered to be within a range of 100 to 1,000Å. Metal for metal layer 13 is selected from a group consisting of cobalt, nickel, palladium, iron and copper. These metals are unique, in that each reacts with silicon at elevated temperatures to form a metal silicide, each has a melting point appreciably greater than 850Å C. (the approximate temperature at which polycrystalline silicon is normally deposited), and none reacts with chlorine, fluorine, or bromine to form volatile compounds with boiling points below approximately 300Å C. (a necessary criterium for a material to be immune to erosion during a halogenatedplasma etch).

Still referring to FIG. 1, a silicon dioxide, hard-material mask 14, which has the desired etch pattern, has been created on top of metal layer 13 using one of any number of techniques. It may, for example, be created by simply patterning a silicon dioxide hard-material masking layer with a photoresist pattern created using conventional photolithography, or it may be created using a more complex process such as the heretofore-mentioned double-pitch masking technique developed by Messrs. Lowrey and Chance. The double-pitch masking pattern depicted in FIG. 1, consisting of a series of substantially parallel silicon dioxide masking stringers 15, is a product of the Lowrey-chance process. Since the Lowrey-Chance process has been disclosed in detail in the heretofore referenced U.S. Pat. application, Ser. No. no attempt will be made to duplicate the same detailed description of the process in this disclosure. Basically, the masking process, as applied to the present metal mask process, involves the blanket deposition of an expendable silicon nitride layer on top of metal layer 13. The expendable layer is then patterned with a photomask consisting of a series of parallel photoresist strips of minimum feature width separated by minimum space width (i.e., feature widths and space widths created using the maximum resolution of available photolithography). The photoresist strips are then subjected to an oxygen plasma etch in order to halve their width. Using these halfwidth photoresist strips, the expendable layer is anisotropically etched down to metal layer 13, thus creating nitride strips having substantially vertical sidewalls. An equivalent, alternative approach to the oxygen plasma etch of the photoresist strips is to add a degree of isotropicity to the anisotropic etch of the nitride layer, so that it is undercut beneath the resist. A silicon dioxide masking layer having a thickness substantially equal to one-half the minimum feature width is then blanket deposited on the in-process wafer. The silicon dioxide masking layer is then anisotropically etched to leave a series of silicon dioxide masking stringers 15 on the sidewalls of the nitride strips. Following a wet nitride etch, only the silicon dioxide masking stringers 15 remain.

Figure 2:
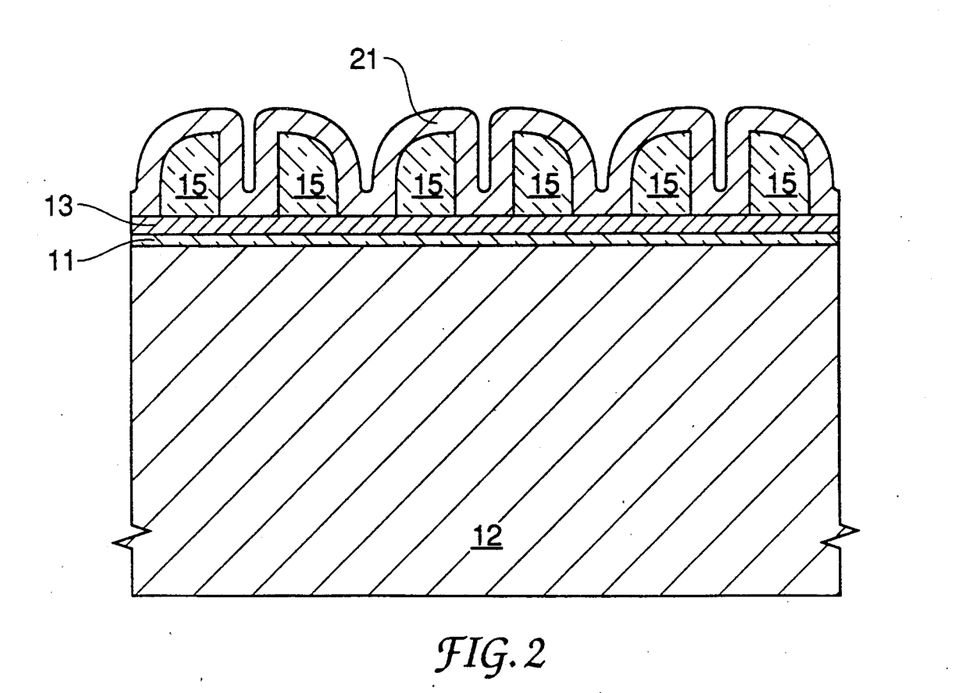
FIG. 2 is a cross-sectional view of the in-process wafer portion of FIG. 1 following the blanket deposition of a polysilicon layer.

Referring now to FIG. 2, a polysilicon layer 21 has been blanket deposited on top of the in-process wafer portion of FIG. 2, completely covering masking stringers 15 and exposed portions of metal layer 13. The thickness of polysilicon layer 21 must be sufficient to completely convert any subjacent metal to silicide when the temperature is sufficiently raised.

Figure 3:
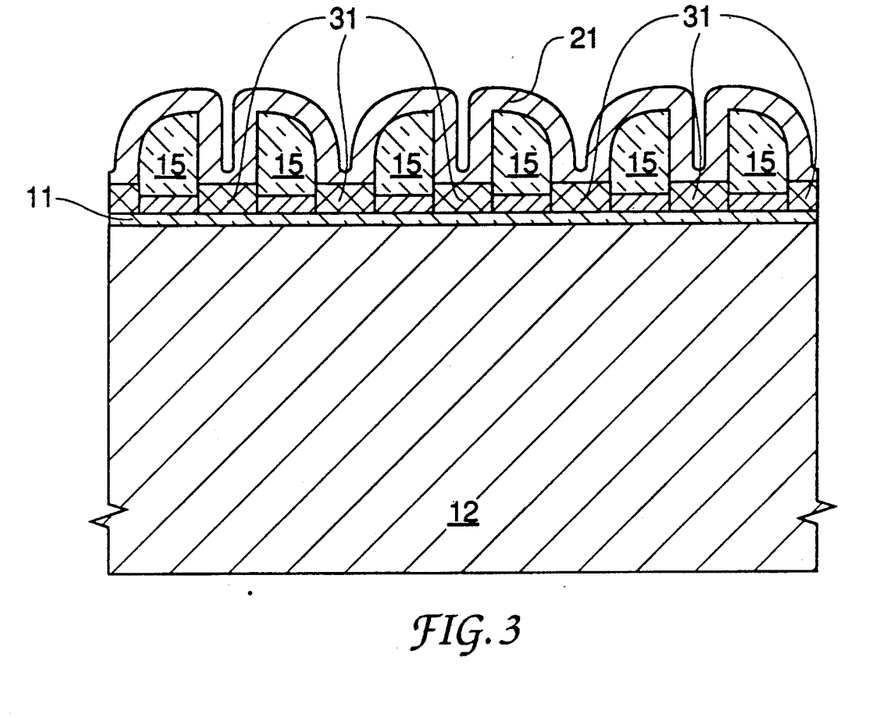
FIG. 3 is a cross-sectional view of the in-process wafer portion of FIG. 4 following an elevated temperature step that has caused silicidation of the metal layer in regions where the polysilicon layer is superjacently in contact therewith.

Referring now to FIG. 3, an elevated temperature step has caused silicidation of metal layer 13 in regions where polysilicon layer 21 is superjacently in contact therewith, resulting in metal silicide patches 31. In regions where metal layer 13 is covered by masking stringers 15, no silicide is formed. Unreacted polysilicon layer remnants 32 cover metal silicide patches 31 and masking stringers 15.

Figure 4:
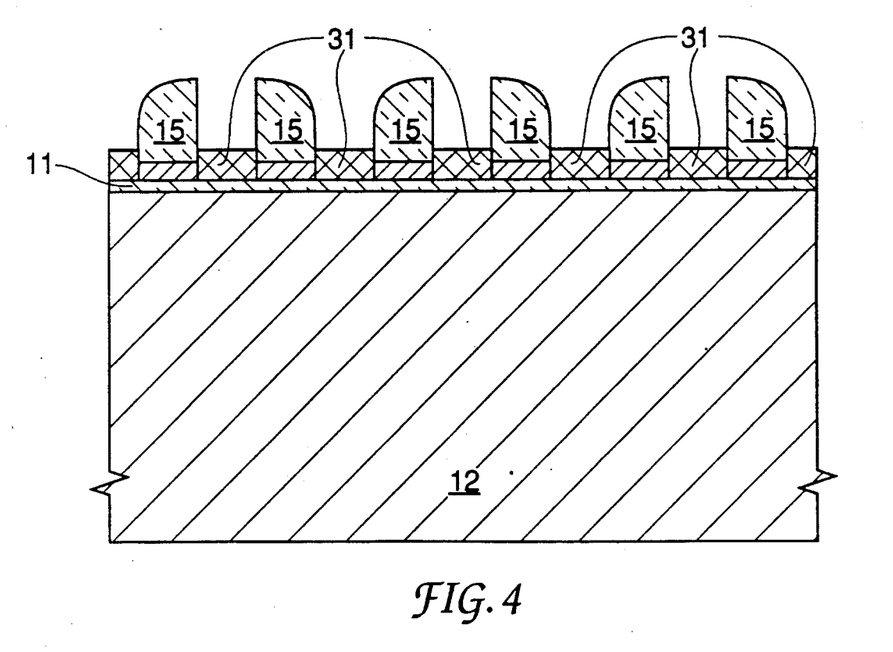
FIG. 4 is a cross-sectional view of the in-process wafer portion of FIG. 3 following removal of unreacted polysilicon with a wet polysilicon etch.

Referring now to FIG. 4, unreacted polysilicon layer remnants 31 have been removed with a wet polysilicon etch.

Figure 5:
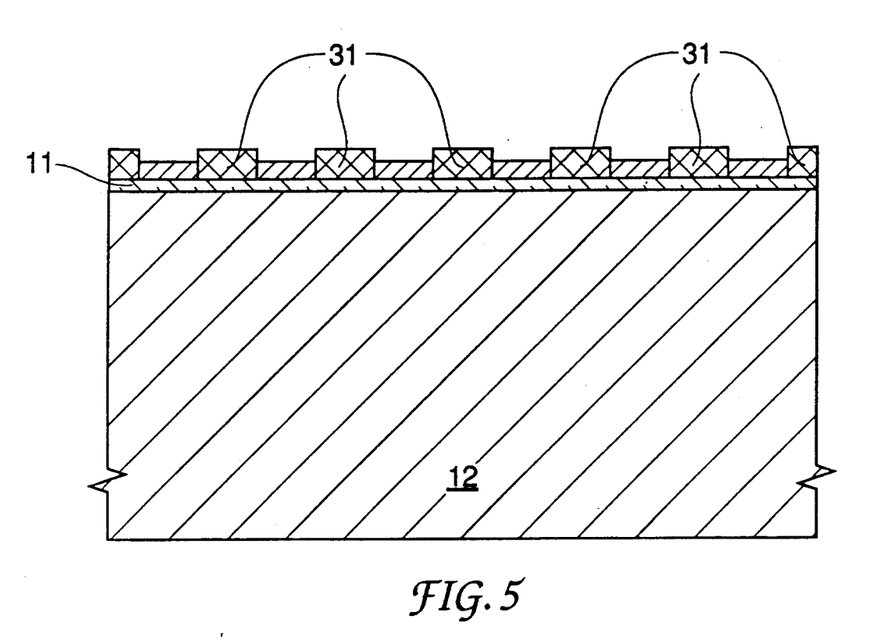
FIG. 5 is a cross-sectional view of the in-process wafer portion of FIG. 4 following removal of the hard-material mask with a wet etch that is selective for silicon dioxide over the existing metal silicide.

Referring now to FIG. 5, masking stringers 15 have been removed with a wet etch that is selective for silicon dioxide over the extent metal silicide so that the silicide may protect isolation layer 11.

Figure 6:
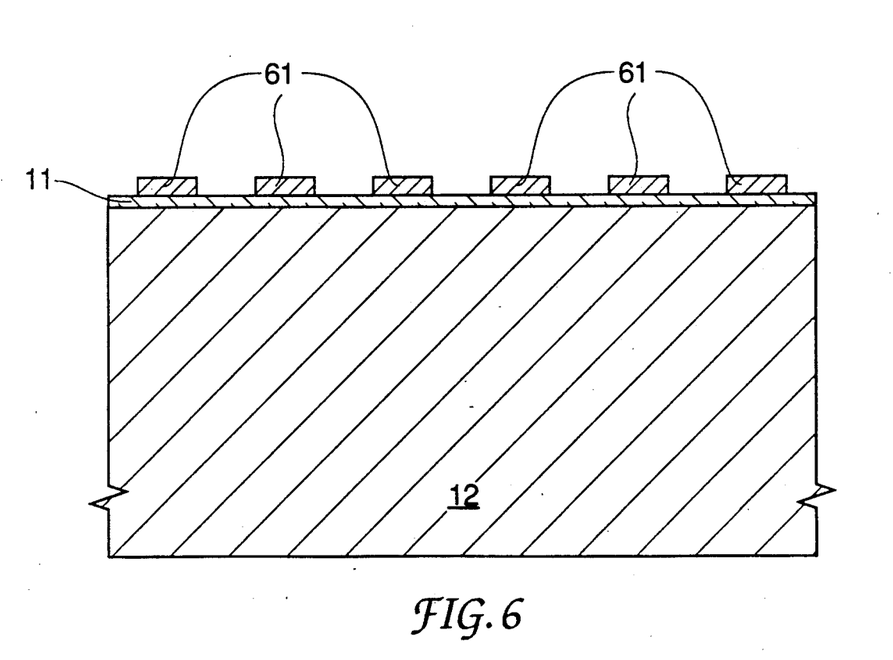
FIG. 6 is a cross-sectional view of the in-process wafer portion of FIG. 5 following removal of the metal silicide with a wet etch selective for silicide over silicon dioxide.

Referring now to FIG. 6, metal silicide patches 31 have been removed with a wet etch selective for silicide over silicon dioxide to avoid undercutting silicon dioxide isolation layer 11 beneath metal layer remnants 61. Metal layer remnants 61 constitute a metal mask which precisely duplicates the pattern of the hard-material mask 14. Portions of silicon dioxide isolation layer 11 that were subjacent the now-removed metal silicide patches 31 are still intact and may be removed at the onset of the trench etch for which the metal mask will be used.

Figure 7:
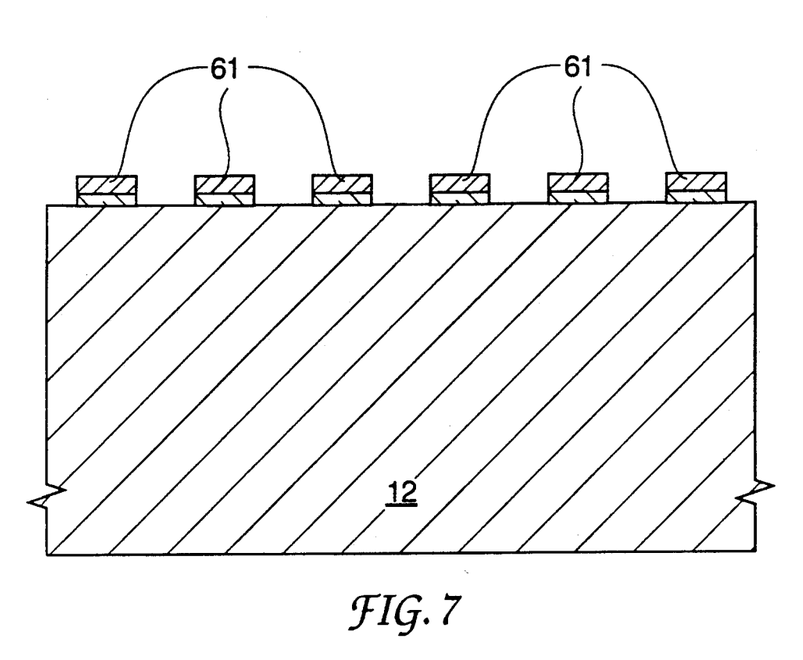
FIG. 7 is a cross-sectional view of the in-process wafer portion of FIG. 6 following removal of exposed portions of the isolation layer with an anisotropic etch.

Referring now to FIG. 7, exposed portions of the isolation layer have been removed with an anisotropic etch. This may be accomplished prior to or simultaneous with the etch of substrate 12.

Figure 8:
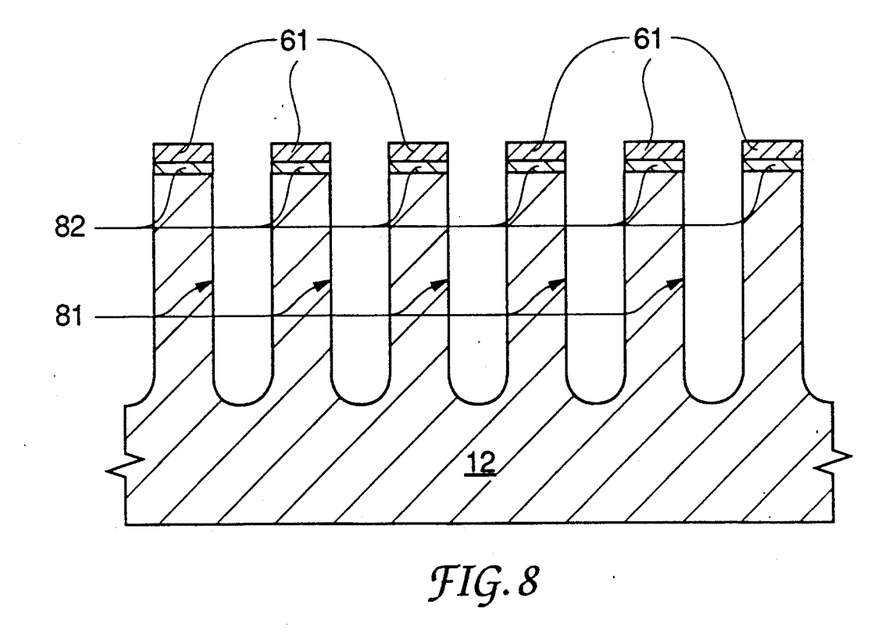
FIG. 8 is a cross-sectional view of the in-process wafer portion of FIG. 7 following an anisotropic halogenated-plasma trench etch.

Referring now to FIG. 8, an anisotropic halogenated-plasma etch has created a series of trenches 81 in substrate 12 with the metal layer remnants 61 functioning as an etch mask. Isolation layer remnants 82 are subjacent to each metal layer remnant 61.

Figure 9:
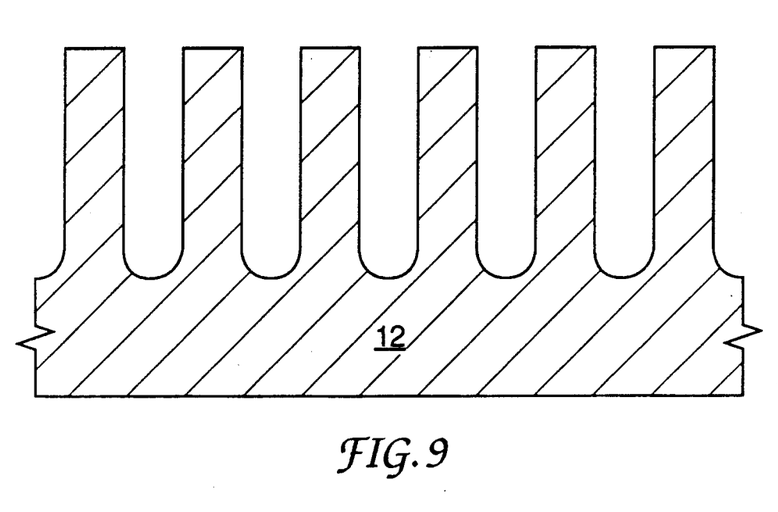
FIG. 9 is a cross-sectional view of the in-process wafer portion of FIG. 8 following removal of the metal mask with aqua regia, and removal of isolation layer remnants with an isotropic wet silicon dioxide etch.

Referring now to FIG. 9, metal layer remnants 61 have been removed with aqua regia, and isolation layer remnants 81 have been removed with a wet silicon dioxide etch.

Although only a single embodiment of the reduced-pitch mask compatible process for creating a metal etch mask, that will not erode in a halogenated-plasma etch environment has been disclosed, it will be apparent to those having ordinary skill in the art, that changes may be made thereto without departing from the spirit and the scope of the process as claimed.

I claim:

1. A process, compatible with reduced-pitch masking technology, for creating a metal etch mask on an in-process wafer that will not erode in a halogenated-plasma etch environment, said process comprising the following sequence of steps:

a) creation of an isolation layer on top of the layer to be etched;
b) deposition of a metal layer on top of the isolation layer;
c) creation of a hard-material mask on top of the metal layer, said hard-material mask having the desired final masking pattern;
d) blanket deposition of a layer of polysilicon, thus completely covering said hard-material mask and portions of the metal layer that are not covered by said hard-material mask;
e) subjecting the in-process wafer to a temperature sufficient to cause the polysilicon to react with those portions of the metal layer that are not covered by said hard-material mask to form patches of metal silicide;
f) removal of unreacted polysilicon with a first isotropic wet etch;
g) removal of the hard-material mask with a second isotropic wet etch; and
h) removal of the metal silicide with a third isotropic wet etch; and
i) removal of exposed remnants of the isolation layer with an anisotropic etch.

2. The process of claim 1 wherein said isolation layer is silicon dioxide.

3. The process of claim 1 wherein the metal for said metal layer is selected from a group consisting of cobalt, nickel, palladium, iron, and copper.

4. The process of claim 1 wherein said hard-material mask is created from silicon dioxide.

5. The process of claim 4 wherein said first isotropic wet etch is selective for polysilicon over silicon dioxide and the extent metal silicide.

6. The process of claim 5 wherein said second isotropic wet etch is selective for silicon dioxide over the extent metal silicide.

7. The process of claim 6 wherein said third isotropic wet etch is selective for the extent metal silicide over silicon dioxide.

8. The process of claim 7 wherein said hard-material mask is created using a pitch-reduction process.

* * * * *

UNITED STATES PATENT AND TRADEMARK OFFICE
CERTIFICATE OF CORRECTION

PATENT NO. : 5,053,105
DATED : October 1, 1991
INVENTOR(S) : Angus C. Fox, III

It is certified that error appears in the above-indentified patent and that said Letters Patent is hereby corrected as shown below:

Column 1, line 34, delete "1/2F" and insert -- 1/8F --.

Column 2, line 53, delete "with" and insert -- which --.

Column 5, line 14, delete "FIG." and insert -- FIG. 1, --.

Column 5, line 28, delete "850ÅC" and insert -- 850°C --.

Column 5, line 32, delete "300ÅC" and insert -- 300°C --.

Column 5, line 50, delete "Ser. No.".

Signed and Sealed this

Eleventh Day of October, 1994

Attest:

BRUCE LEHMAN

*Attesting Officer*    *Commissioner of Patents and Trademarks*